US011915941B2

(12) United States Patent
Faguet et al.

(10) Patent No.: US 11,915,941 B2
(45) Date of Patent: Feb. 27, 2024

(54) DYNAMICALLY ADJUSTED PURGE TIMING IN WET ATOMIC LAYER ETCHING

(71) Applicant: Tokyo Electron Limited, Tokyo (JP)

(72) Inventors: Jacques Faguet, Austin, TX (US); Tetsuya Sakazaki, Koshi (JP); Paul Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 283 days.

(21) Appl. No.: 17/580,936

(22) Filed: Jan. 21, 2022

(65) Prior Publication Data

US 2022/0254646 A1  Aug. 11, 2022

Related U.S. Application Data

(60) Provisional application No. 63/148,563, filed on Feb. 11, 2021.

(51) Int. Cl.
*H01L 21/311* (2006.01)
*H01L 21/67* (2006.01)

(52) U.S. Cl.
CPC .. *H01L 21/31116* (2013.01); *H01L 21/67075* (2013.01)

(58) Field of Classification Search
None
See application file for complete search history.

(56) References Cited

U.S. PATENT DOCUMENTS

| 5,374,328 A | 12/1994 | Remba et al. |
| 6,616,014 B1 | 9/2003 | Pozniak et al. |
| 6,841,031 B2 | 1/2005 | Iwata et al. |
| 6,896,600 B1 | 5/2005 | Wu et al. |
| 10,157,756 B2 | 12/2018 | Yamada |
| 10,982,335 B2 | 4/2021 | Abel |
| 2002/0004303 A1 | 1/2002 | Agnello |
| 2003/0087528 A1 | 5/2003 | Kruwinus |

(Continued)

FOREIGN PATENT DOCUMENTS

| JP | 11354482 | 12/1999 |
| KR | 1020170022922 | 3/2017 |

(Continued)

OTHER PUBLICATIONS

International Search Report issued in Application No. PCT/US2019/061683, dated Mar. 13, 2020, 9 pgs.

(Continued)

*Primary Examiner* — Roberts P Culbert
(74) *Attorney, Agent, or Firm* — Egan, Enders & Huston LLP.

(57) ABSTRACT

The present disclosure provides various embodiments of an improved wet atomic layer etching (ALE) process. More specifically, the present disclosure provides various embodiments of methods that improve a wet ALE process by providing a dynamic ALE cycle timing schedule that balances throughput and etch rate with post-etch surface roughness. As described in more detail below, the methods disclosed herein may adjust the purge timing between ALE cycles and/or between individual surface modification and selective dissolution steps to provide a desired throughput, etch rate and/or post-etch surface roughness in a wet ALE process.

21 Claims, 13 Drawing Sheets

(56) References Cited

U.S. PATENT DOCUMENTS

| | | |
|---|---|---|
| 2006/0289389 A1 | 12/2006 | Shea |
| 2009/0007938 A1 | 1/2009 | Dubreuil et al. |
| 2009/0047790 A1 | 2/2009 | Raghu et al. |
| 2010/0279435 A1 | 11/2010 | Xu et al. |
| 2011/0094888 A1 | 4/2011 | Chen et al. |
| 2012/0031768 A1 | 2/2012 | Reid et al. |
| 2014/0199840 A1 | 7/2014 | Bajaj et al. |
| 2014/0370643 A1 | 12/2014 | Stern et al. |
| 2016/0089686 A1 | 3/2016 | Lee et al. |
| 2016/0141210 A1 | 5/2016 | Lei et al. |
| 2016/0372320 A1 | 12/2016 | Emoto |
| 2017/0243755 A1 | 8/2017 | Tapily |
| 2017/0356084 A1 | 12/2017 | Nakanishi et al. |
| 2018/0090352 A1 | 3/2018 | Sotoku et al. |
| 2018/0226278 A1 | 8/2018 | Arnepalli et al. |
| 2018/0374936 A1 | 12/2018 | Kelly et al. |
| 2019/0011734 A1 | 1/2019 | Otsuji |
| 2019/0027383 A1 | 1/2019 | Nakal et al. |
| 2019/0148192 A1 | 5/2019 | Yamaguchi |
| 2019/0157105 A1 | 5/2019 | Fischer et al. |
| 2020/0157693 A1* | 5/2020 | Abel .................. C23G 1/10 |
| 2020/0161148 A1 | 5/2020 | Abel |
| 2020/0312620 A1 | 10/2020 | Blomberg et al. |

FOREIGN PATENT DOCUMENTS

| | | |
|---|---|---|
| KR | 1020170077839 | 7/2017 |
| WO | 2018004649 | 1/2018 |
| WO | 2020102655 | 5/2020 |

OTHER PUBLICATIONS

International Search Report Issued in Application No. PCT/US2019/061678, dated Mar. 13, 2020, 8 pgs.

Abel et al., "Methods for Etching a Substrate Using a Hybrid Wet Atomic Layer Etching Process", U.S. Appl. No. 17/580,879, filed Jan. 21, 2022, 40 pgs.

Abel et al., "Systems for Etching a Substrate Using a Hybrid Wet Atomic Layer Etching Process", U.S. Appl. No. 17/584,667, filed Jan. 26, 2022, 48 pgs.

Internal Search Report issued in PCT/US2022/013827, dated May 13, 2022, 9 pgs.

* cited by examiner

DYNAMICALLY ADJUSTED PURGE TIMING IN WET ATOMIC LAYER ETCHING

This application claims priority to U.S. Provisional Patent Application Ser. No. 63/148,563, filed Feb. 11, 2021, entitled "Dynamic Dispense Timing in Wet Atomic Layer Etching"; the disclosure of which is expressly incorporated herein, in their entirety, by reference.

BACKGROUND

The present disclosure relates to the processing of substrates. In particular, it provides a method of etching of layers on substrates.

During substrate processing, a variety of techniques are known for etching various layers on a substrate. Plasma etching and wet etching are two well-known techniques. Wet etching involves dispensing a chemical solution over the surface of a substrate or immersing the substrate in the chemical solution. Often, the chemical solution contains a solvent, chemicals designed to react with materials on the substrate surface, and chemicals to promote dissolution of the reaction products. The result of exposure of the substrate surface to the etchant is the removal of material from the substrate. Etchant composition and temperature may control the etch rate, specificity, and residual material on the surface of the substrate post etch.

Thermodynamics and kinetics both play roles in etchant formulation. The desired reactions need to be both thermodynamically and kinetically favorable for a successful etch. The requirements for success become much more stringent for etching polycrystalline materials. For these materials, it is desirable that the removal rates for each individual crystallite facet and grain boundary geometry is substantially similar regardless or crystallite morphology or environment. Surface roughness plays an important role in interface quality and electrical properties of nanoscale features. When etching nanoscale polycrystalline materials, differing etch rates at grain boundaries compared to the different crystal facets leads to roughening of the surface during etching. Further, it is desirable that the material removal rate should be uniform at the macroscopic and microscopic levels and occurs at a rate that is compatible with high volume manufacturing. Macroscopic uniformity can be addressed with careful engineering, but microscopic uniformity depends on the chemistry of the etch itself.

As geometries of substrate structures continue to shrink and the types of structures evolve, the challenges of etching substrates have increased. One technique that has been utilized to address these challenges is atomic layer etching (ALE). ALE processes are generally known to involve processes which remove thin layers sequentially through one or more self-limiting reactions. For example, ALE typically refers to techniques that can etch with atomic precision, i.e., by removing material one or a few monolayers at a time. ALE processes generally rely on a chemical modification of the surface to be etched followed by a selective removal of the modified layer. Thus, ALE processes offer improved performance by decoupling the etch process into sequential steps of surface modification and removal of the modified surface. Such processes often include multiple cyclic series of layer modification and etch steps, where the modification step modifies the exposed surfaces and the etch step selectively removes the modified layer. Thus, in some ALE processes, a series of self-limiting reactions may occur and the cycle may be repeatedly performed. In other embodiments, an ALE process may use just one cycle.

A variety of ALE processes are known, including plasma ALE, thermal ALE and wet ALE techniques. In wet ALE, material is removed from a surface in a cyclic process utilizing self-limiting and selective reactions. The name "wet ALE" indicates that some, if not all, of the reactions take place in the liquid phase. The wet ALE process begins with a self-limiting surface modification step, which can be achieved through oxidation, reduction, ligand binding, or ligand exchange. Ideally, the modified layer is confined to the top monolayer of the material and acts as a passivation layer to prevent the modification reaction from progressing further. The second step of the wet ALE process is selective dissolution of the modified layer. The process must dissolve the modified layer without removing any of the underlying unmodified material. This can be accomplished by using a different solvent in the second step than was used in the first step, changing the pH, or changing the concentration of other components in the first solvent.

In wet ALE, purge steps are performed in between the surface modification step and the selective dissolution step, typically by rinsing the modified surface layer with a purge solution to remove excess reactants. The purpose of the purge step is to ensure that there is no mixing between the solution used for surface modification and the solution used for dissolution. If these two solutions mix, it is possible that solution mixture can both modify and dissolve the substrate. Mixing the solutions prevents the modification reaction from being self-limiting and leads to continuous etching. Continuous etches tend to preferentially etch at grain boundaries, which results in a rough post-etch surface.

Being an atomic layer process, wet ALE tends to be slow. Each reaction must have enough time to be driven to saturation and each purge step must be sufficient to completely separate the surface modification solution and the dissolution solution. This can lead to low throughput in high volume manufacturing (HVM) making wet ALE an expensive process.

SUMMARY

The present disclosure provides various embodiments of an improved wet atomic layer etching (ALE) process. More specifically, the present disclosure provides various embodiments of methods that improve a wet ALE process by providing a dynamic ALE cycle timing schedule that balances throughput and etch rate with post-etch surface roughness. As described in more detail below, the methods disclosed herein may adjust the purge timing between ALE cycles, and/or between individual surface modification and selective dissolution steps, to provide a desired throughput, etch rate and/or post-etch surface roughness in a wet ALE process.

For example, the throughput of a wet ALE process can be improved by reducing the time given to each process, but this comes with some expense. Reducing the time given to the surface modification or dissolution steps can lower the etch amount per ALE cycle, if the reaction is no longer driven to saturation. On the other hand, the purge time between the surface modification and dissolution steps can be reduced to increase the etch amount per ALE cycle by allowing the surface modification and dissolution solutions to mix, thereby introducing some amount of continuous etching into the process. While the self-limiting nature of wet ALE leads to smoothing of a surface during etching, continuous etches tend to roughen polycrystalline surfaces due to the higher reactivity at grain boundaries. Thus, improving throughput by reducing purge times typically comes at the expense of post-etch surface roughness.

Embodiments of the present disclosure improve upon known wet ALE processes by providing a dynamic ALE cycle timing schedule to balance the demands of throughput and overall etch rate with the need for low post-etch surface roughness. In some embodiments, purge times can be dynamically adjusted to: (a) increase the etch rate during an initial stage of a wet ALE process, and (b) decrease the etch rate during a final stage of the wet ALE process. For example, purge times can be relatively short (or be completely removed) during one or more cycles performed at the beginning of a wet ALE process to promote a fast etch rate, which decreases the cycle time during the initial stage. The purge times can then be increased during subsequent cycles, as the etch progresses, in order to promote low roughness on the post-etch surface in the final stage of the wet ALE process. In some embodiments, purge times used during an intermediate stage of the wet ALE process may be adjusted to balance the needs of etch rate and surface roughness. Such embodiments can simultaneously improve throughput, while maintaining an acceptable level of post-etch surface roughness, for wet ALE processing.

In other embodiments, the purge times can be dynamically adjusted to compensate for diffusion-controlled aspect ratio dependence of the etch process. When wet ALE is used as a recess etch, for example, purge times can be adjusted dynamically as the etch progresses to compensate for changes in aspect ratio. At the beginning of the etch process, for example, the aspect ratio of the etch profile is zero. As material is removed from exposed surfaces, the aspect ratio of the recess (or another feature) increases and reaches a maximum when the etch reaches its endpoint. Because the chance of solutions mixing is lower in lower aspect ratio features, purge times can be shorter at the beginning of the etch process to increase etch rate. As the etch progresses and the aspect ratio increases, the purge times between the surface modification and dissolution steps can be dynamically increased to maintain adequate separation of the etch solutions and to improve surface roughness by avoiding continuous etching in the latter stage of the etch.

A method is provided herein for etching a substrate using a wet atomic layer etching (ALE) process according to a first embodiment. In the first embodiment, the method includes receiving the substrate, the substrate having a material exposed; and selectively etching the material by performing multiple cycles of the wet ALE process, wherein each cycle includes: a) performing one or more surface modification steps to chemically modify an exposed surface of the material and provide a modified surface layer, wherein the one or more surface modification steps includes exposing the exposed surface of the material to at least one surface modification solution to chemically modify the exposed surface of the material; b) performing a first purge step after the one or more surface modification steps, wherein the first purge step includes rinsing the substrate with a solvent; c) performing a dissolution step after the first purge step to selectively remove the modified surface layer of the material, wherein the dissolution step includes exposing the modified surface layer to a dissolution solution to dissolve the modified surface layer; and d) performing a second purge step after the dissolution step, wherein the second purge step includes rinsing the substrate with a solvent or performing a spin dry step. The method described in the first embodiment may also include adjusting a purge time of the first purge step and/or a purge time the second purge step during one or more cycles of the wet ALE process to provide a desired throughput, etch rate and/or post-etch surface roughness in the wet ALE process.

In some embodiments, said a) performing one or more surface modification steps may include: exposing the exposed surface of the material to an oxidizing agent in a first surface modification step to chemically modify the exposed surface of the material and provide the modified surface layer; and exposing the modified surface layer to a complexing agent in a second surface modification step to bind the complexing agent to the modified surface layer and provide a complex-bound modified surface layer. In such embodiments, said c) performing the dissolution step may include selectively removing the complex-bound modified surface layer of the material by exposing the complex-bound modified surface layer to the dissolution solution to dissolve the complex-bound modified surface layer. In some embodiments, said exposing the complex-bound modified surface layer to the dissolution solution may dissolve the complex-bound modified surface layer and reform a modified surface layer on newly exposed surfaces of the material.

In some embodiments, said adjusting the purge time of the first purge step and/or the purge time of the second purge step may include increasing the purge time of the first purge step and/or the purge time of the second purge step as the wet ALE process progresses.

In other embodiments, said adjusting the purge time of the first purge step and/or the purge time of the second purge step may include: reducing the purge time of the first purge step and/or the purge time of the second purge step during one or more first cycles of the wet ALE process to increase the etch rate achieved during the one or more first cycles; and increasing the purge time of the first purge step and/or the purge time of the second purge step during one or more second cycles of the wet ALE process to reduce the post-etch surface roughness achieved during the one or more second cycles. In such embodiments, the one or more second cycles may be performed after the one or more first cycles.

In other embodiments, said adjusting the purge time of the first purge step and/or the purge time of the second purge step may include reducing the purge time of the first purge step and eliminating the second purge step during each cycle of the wet ALE process to increase the etch rate and improve the throughput.

In other embodiments, said adjusting the purge time of the first purge step and/or the purge time of the second purge step may include: eliminating the first purge step and/or the second purge step during one or more first cycles of the wet ALE process; performing the first purge step and/or the second purge step during one or more second cycles of the wet ALE process, wherein the one or more second cycles are performed after the one or more first cycles, and wherein the purge time of the first purge step and/or the purge time of the second purge step performed during the one or more second cycles is insufficient to prevent mixing between the at least one surface modification solution and the dissolution solution; and performing the first purge step and/or the second purge step during one or more third cycles of the wet ALE process, wherein the one or more third cycles are performed after the one or more second cycles, and wherein the purge time of the first purge step and/or the purge time of the second purge step performed during the one or more third cycles prevents mixing between the at least one surface modification solution and the dissolution solution.

Another method is provided herein for etching a substrate using a wet atomic layer etching (ALE) process according to a second embodiment. In the second embodiment, the method comprises receiving the substrate, the substrate having a material exposed; and selectively etching the material by performing multiple cycles of the wet ALE process, wherein each cycle includes: a) chemically modifying an exposed surface of the material to provide a modified surface layer, wherein said exposed surface is chemically modified by oxidation of the material using an oxidizing agent; b) binding a complexing agent to the modified surface layer of the material to provide a complex-bound modified surface layer; c) rinsing the substrate with a solvent; and d) selectively removing the complex-bound modified surface layer of the material by exposing the complex-bound modified surface layer to a dissolution solution to dissolve the complex-bound modified surface layer. In the second embodiment, said rinsing the substrate may be performed for a first time period during one or more first cycles of the wet ALE process, and said rinsing the substrate may be performed for a second time period during one or more second cycles of the wet ALE process, wherein the one or more second cycles are performed after the one or more first cycles, and wherein the second time period is longer than the first time period.

Yet another method is provided herein for etching a substrate using a wet atomic layer etching (ALE) process according to a third embodiment. In the third embodiment, the method comprises receiving the substrate, the substrate having a material exposed, the material comprising a polycrystalline material; and selectively etching the polycrystalline material by performing multiple cycles of the wet ALE process, wherein each cycle includes: a) chemically modifying an exposed surface of the polycrystalline material to provide a modified surface layer, wherein said exposed surface is chemically modified by oxidation of the polycrystalline material using an oxidizing agent; b) binding a complexing agent to the modified surface layer of the polycrystalline material to provide a complex-bound modified surface layer; c) rinsing the substrate with a solvent; and d) selectively removing the complex-bound modified surface layer of the polycrystalline material by exposing the complex-bound modified surface layer to a dissolution solution to dissolve the complex-bound modified surface layer. In the third embodiment, said rinsing the substrate may be performed for a time period that increases during said performing the multiple cycles of the wet ALE process.

In the second and third embodiments, the order and/or timing of the steps a)-d) performed during each cycle of the wet ALE process may sometimes differ. In some embodiments, the steps a)-d) may be performed sequentially with no temporal overlap during each cycle of the wet ALE process. In other embodiments, one or more of the steps may be performed at substantially the same time. For example, steps a) and b) may be performed with at least partial temporal overlap during each cycle of the wet ALE process, in some embodiments. In other embodiments, steps b) and d) may be performed with at least partial temporal overlap during each cycle of the wet ALE process.

The methods described herein may be used to etch a wide variety of materials, including polycrystalline materials, single-crystalline materials and amorphous materials. In some embodiments, the methods described herein may be used to etch a polycrystalline metal material such as, for example, a transition metal. Examples of transition metals that may be etched using the methods disclosed herein include, but are not limited to, copper (Cu), ruthenium (Ru) and cobalt (Co).

The methods described herein offer multiple advantages over other etch techniques. For example, the methods described herein provide the benefits of ALE, such as precise control of total etch amount, control of surface roughness, and improvements in wafer-scale uniformity. The methods described herein also provide various benefits of wet etching, such as the simplicity of the etch chamber, atmospheric temperature and pressure etching conditions, and reduced surface roughness. Unlike conventional wet ALE processes, which tend to be slow, the methods described herein provide a dynamic ALE cycle timing schedule that balances throughput and etch rate with post-etch surface roughness.

In some embodiments, the methods disclosed herein may reduce the post-etch surface roughness. For example, the exposed surface of the material may have a surface roughness characterized by a first surface roughness value after one or more first cycles of the wet ALE process are performed. After one or more second cycles of the wet ALE process are performed, the surface roughness of the exposed surface of the material may be reduced to a second surface roughness, which is less than the first surface roughness.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
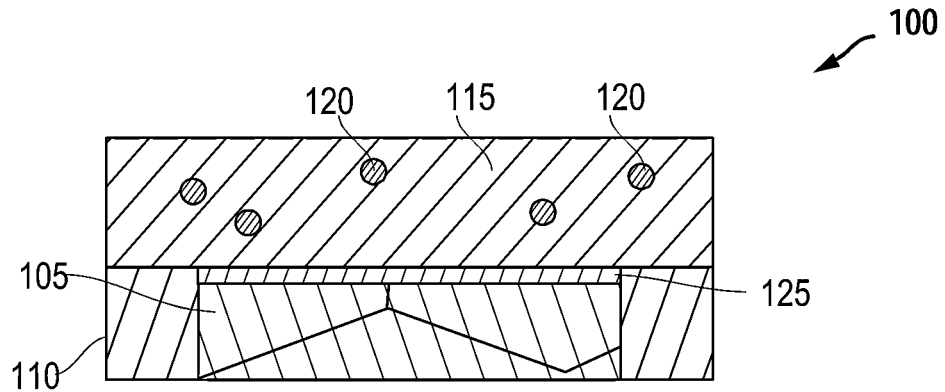
FIGS. 1A-1E illustrates one example of a cyclic wet atomic layer etching (ALE) process in accordance with the present disclosure.

The present disclosure provides various embodiments of an improved wet atomic layer etching (ALE) process. More specifically, the present disclosure provides various embodiments of methods that improve a wet ALE process by providing a dynamic ALE cycle timing schedule that balances throughput and etch rate with post-etch surface roughness. As described in more detail below, the methods disclosed herein may adjust the purge timing between ALE cycles and/or between individual surface modification and selective dissolution steps to provide a desired throughput, etch rate and/or post-etch surface roughness in a wet ALE process.

In some embodiments, the purge times can be dynamically adjusted to: (a) increase the etch rate during an initial stage of a wet ALE process, and (b) decrease the etch rate during a final stage of the wet ALE process. For example, purge times can be relatively short (or be completely removed) during one or more cycles performed at the beginning of a wet ALE process to promote a fast etch rate, which decreases the cycle time during the initial stage. The purge times can then be increased during subsequent cycles, as the etch progresses, in order to promote low roughness on the post-etch surface in the final stage of the wet ALE process. In some embodiments, purge times used during an intermediate stage of the wet ALE process may be adjusted to balance the needs of etch rate and surface roughness. Such embodiments can simultaneously improve throughput, while maintaining an acceptable level of post-etch surface roughness, for wet ALE processing.

In other embodiments, the purge times can be dynamically adjusted to compensate for diffusion-controlled aspect ratio dependence of the etch process. When wet ALE is used as a recess etch, for example, purge times can be adjusted dynamically as the etch progresses to compensate for changes in aspect ratio. At the beginning of the etch process, for example, the aspect ratio of the etch profile is zero. As material is removed from exposed surfaces, the aspect ratio of the recess (or another feature) increases and reaches a maximum when the etch reaches its endpoint. Because the chance of solutions mixing is lower in lower aspect ratio features, purge times can be shorter at the beginning of the etch process to increase etch rate. As the etch progresses and the aspect ratio increases, the purge times between the surface modification and dissolution steps can be dynamically increased to maintain adequate separation of the etch solutions and to improve surface roughness by avoiding continuous etching in the latter stages of the etch.

The techniques described herein offer multiple advantages over other etch techniques. For example, the techniques described herein provide the benefits of ALE, such as precise control of total etch amount, control of surface roughness, and improvements in wafer-scale uniformity. The techniques described herein also provide various benefits of wet etching, such as the simplicity of the etch chamber, atmospheric temperature and pressure etching conditions, and reduced surface roughness. Unlike conventional wet ALE processes, which tend to be slow, the techniques described herein provide a dynamic ALE cycle timing schedule that balances throughput and etch rate with post-etch surface roughness.

The techniques described herein may be performed on a wide variety of substrates having a wide variety of layers and features formed thereon. In general, the substrates utilized with the techniques disclosed herein may be any substrates for which the etching of material is desirable. For example, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

The techniques described herein may also be used to etch a wide variety of materials. Such materials may include polycrystalline materials, single-crystalline materials and amorphous materials. In some embodiments, the techniques described herein may be used to etch a polycrystalline metal material such as, but not limited to, transition metals and noble metals. In one exemplary embodiment, the material to be etched may be a polycrystalline cobalt material. Although the techniques described herein are discussed below with relation to etching a polycrystalline cobalt material, it will be recognized by those skilled in the art that such an example is merely exemplary and the techniques described herein may be used to etch other materials.

Although many chemicals can be used to etch polycrystalline cobalt, controlling surface roughness during etching is difficult. In particular, pitting and preferential etching at grain boundaries is difficult to prevent when etching polycrystalline cobalt. Because zero valent cobalt is generally insoluble, exposed surfaces of the polycrystalline cobalt material must first be modified before it can be dissolved in solution. In one example wet ALE process, exposed surfaces of the polycrystalline cobalt material may be oxidized in a surface modification step, and the oxidized species may be dissolved into solution in a subsequent dissolution step. Purge steps may be performed between the surface modification and dissolution steps and the process may be repeated in a cyclic manner until a desired amount of etching is achieved.

FIGS. 1A-1E illustrate one example of a cyclic wet ALE process. More specifically, FIGS. 1A-1E illustrate one cycle of a wet ALE process for etching a material, such as but not limited to, a polycrystalline material 105. As shown in FIG. 1A, a polycrystalline material 105 surrounded by a dielectric material 110 is brought in contact with a surface modification solution 115 during a first surface modification step 100 to modify exposed surfaces of the polycrystalline material 105. In one embodiment, the polycrystalline material 105 to be etched can be, for example, a transition metal. In one example embodiment, the polycrystalline material 105 can include copper (Cu) metal, ruthenium (Ru) metal or cobalt (Co) metal. In some embodiments, the surface modification solution 115 shown in FIG. 1A can include an oxidizing agent 120. In one embodiment, the surface modification solution 115 may include a chemical solution containing dissolved oxygen or another oxidizing agent, or a solvent (such as water) that directly participates in the oxidation of the surface. In another embodiment, the surface modification solution 115 may be an oxygen-saturated chemical solution that includes oxygen dissolved in water, alcohol, or a ketone (such as acetone).

As shown in FIG. 1A, a chemical reaction occurs at the exposed surface of the polycrystalline material 105 to form a modified surface layer 125 (e.g., a native oxide layer, such as a cobalt oxide). This modified surface layer 125 can be an oxidation product, a reduction product, a ligand bound surface atom, or a surface atom whose ligand has exchanged with the ligands present in solution. In some cases, the reaction may be fast and self-limiting—i.e., the reaction product may modify one or more monolayers of the exposed surface of the polycrystalline material 105, but may prevent any further reaction between the surface modification solution 115 and the underlying surface. By necessity, neither the polycrystalline material 105 to be etched nor the modified surface layer 125 can be soluble in the surface modification solution 115. In some cases, the surface modification step 100 shown in FIG. 1A may continue until the surface reaction is driven to saturation.

Figure 1B:
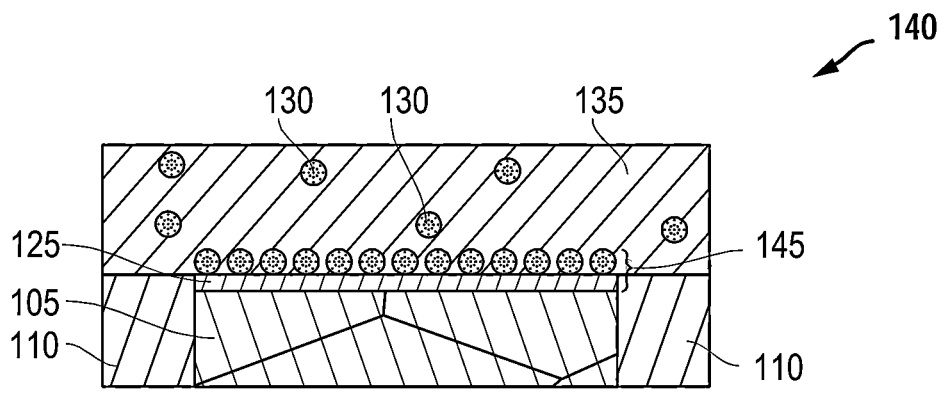

In some embodiments, the modified surface layer 125 shown in FIG. 1A may be exposed to a complexing agent 130 dissolved in a non-aqueous solution 135 during a second surface modification step 140, as shown in FIG. 1B. In FIG. 1B, the exposed surface of the polycrystalline material 105 is further modified when the complexing agent 130 (e.g., a carboxylate-based ligand) binds to the modified surface layer 125 (e.g., a native oxide layer) to form a metal-ligand complex 145. In one example, the complexing agent 130 can include a mono- or poly-carboxylate such as citrate or oxalate. A carboxylate is a derivative of the corresponding carboxylic acid; that is, the salts, esters, and the polyatomic anion found in solution. In one example, the second surface modification step 140 shown in FIG. 1B may be done in a non-aqueous solution 135, such as isopropyl alcohol or acetone, where the ligand is soluble but the metal-ligand complex 145 is not.

Figure 1C:
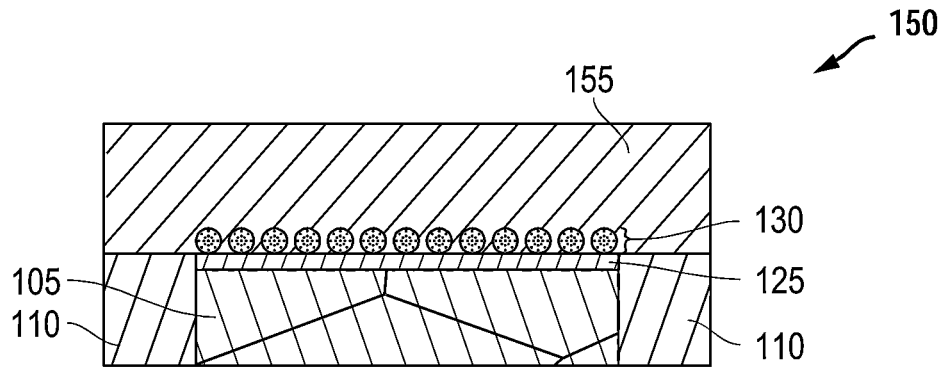

As shown in FIG. 1C, a first purge step 150 is performed after the surface modification steps shown in FIGS. 1A and 1B. In the first purge step 150, the polycrystalline material 105 with the modified surface layer 125 is rinsed with a purge solution 155 to remove excess reactants. The purge solution 155 should not react with the modified surface layer 125 or with the reagents present in the non-aqueous solution 135. In some embodiments, the first purge step 150 is conducted using pure solvent (e.g., purge solution 155 may be pure isopropyl alcohol or acetone) to remove free carboxylate ligands from the non-aqueous solution 135, before a dissolution solution 165 is used in a subsequent dissolution step 160 (shown in FIG. 1D) to dissolve the metal-ligand complex 145. In some embodiments, the first purge step 150 may be long enough to completely remove all excess reactants from the wafer surface.

Figure 1D:
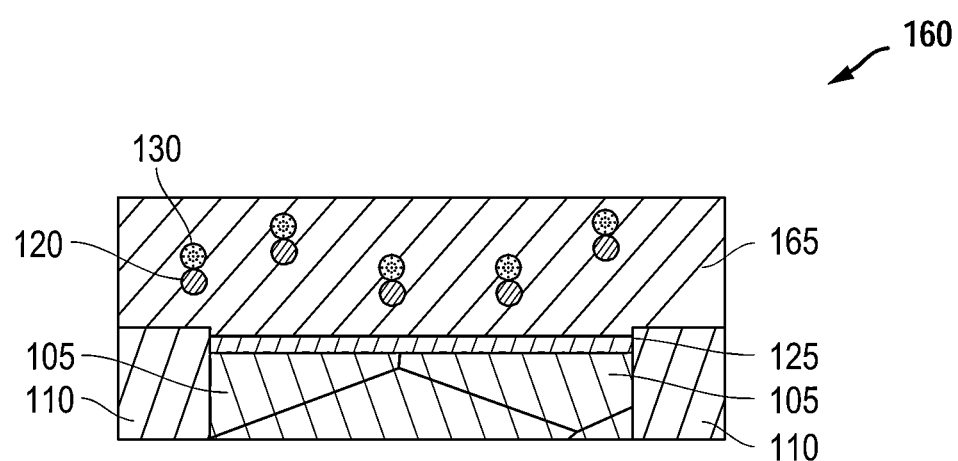

Once rinsed, the polycrystalline material 105 is brought in contact with a dissolution solution 165 in a dissolution step 160 to dissolve or remove the modified surface layer 125, as shown in FIG. 1D. The modified surface layer 125 must be soluble in the dissolution solution 165, while the unmodified polycrystalline material 105 underlying the modified surface layer 125 must be insoluble. The solubility of the modified surface layer 125 allows its removal through dissolution into the bulk dissolution solution 165. In one embodiment, a water rinse (e.g., deionized water) may be used as a dissolution solution 165. In such an embodiment, the dissolution solution 165 shown in FIG. 1D may be used to both dissolve the metal-ligand complex 145 and reform a new modified surface layer 125 (e.g., a native oxide layer, such as a cobalt oxide) on exposed surfaces of the polycrystalline material 105. The dissolution step 160 may continue until the modified surface layer 125 is completely dissolved and reformed.

Figure 1E:
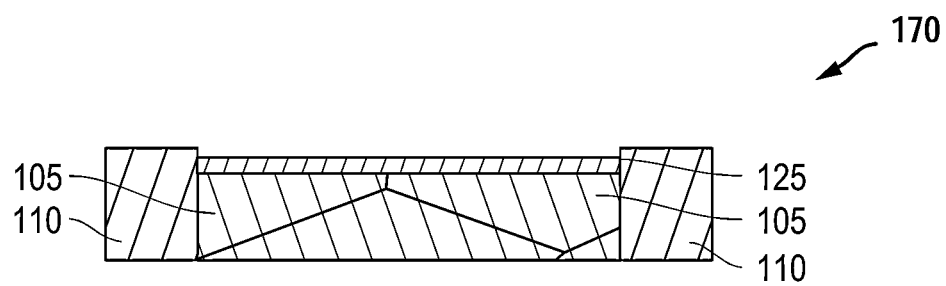

Once the modified surface layer is dissolved and reformed, the ALE etch cycle is finished in FIG. 1E by performing a second purge step 170 using, for example, pure solvent or a spin dry step. In some embodiments, the second purge step 170 may be performed by rinsing the surface with a second purge solution (not shown in FIG. 1E) having the same properties as listed above for the first purge solution 155. In some embodiments, the second purge step 170 may be continued until the dissolution solution 165 is completely displaced from the surface.

The first purge step 150 and the second purge step 170 are typically used to prevent any mixing between the surface modification solution and the dissolving solution. It is often the case that a mixture of these two solutions can both modify the material surface and dissolve the modified material. This leads to a continuous etch process that undermines the benefits of wet ALE.

It is recognized that the cyclic wet ALE process shown in FIGS. 1A-1E is merely one example of an etch process that may be used to etch a polycrystalline material in accordance with the techniques described herein. As noted above, the cyclic wet ALE process described above includes: a) a first surface modification step 100 to chemically modify exposed surfaces of a polycrystalline material 105 (e.g., by oxidation of the polycrystalline material using an oxidizing agent) to provide a modified surface layer 125 (see, FIG. 1A); b) a second surface modification step 140 to bind a complexing agent 130 to the modified surface layer 125 to form a complex-bound modified surface layer (e.g., metal-ligand complex 145) (see, FIG. 1B); c) a first purge step 150 to rinse the substrate with a purge solution 155 (e.g., a solvent) to remove excess reactants (see, FIG. 1C); d) a dissolution step 160 to dissolve or remove the complex-bound modified surface layer by exposing the complex-bound modified surface layer to a dissolution solution 165 to dissolve the complex-bound modified surface layer (see, FIG. 1D); and e) a second purge step 170 to rinse the substrate with a second purge solution and displace the dissolution solution 165 from the surface of the substrate (see, FIG. 1E).

In some embodiments, the steps a)-e) may be performed sequentially, during each cycle of the cyclic wet ALE process, as shown in FIGS. 1A-1E and described above. In other embodiments, one or more of the steps may be performed at substantially the same time. In some embodiments, for example, steps a) and b) may be performed with at least partial temporal overlap during each cycle of the cyclic wet ALE process. Alternatively, steps b) and d) may be performed with at least partial temporal overlap during each cycle of the cyclic wet ALE process. As such, the order of steps performed during each cycle of the cyclic wet ALE process described herein is not strictly limited to the order shown in FIGS. 1A-1E.

The time required to complete the steps in the cyclic wet ALE process shown in FIGS. 1A-1E, combined with the fact that each cycle leads to the removal of one or more monolayers of material, make wet ALE a slow process. When run slowly, with each process driven to saturation, many benefits are realized. First, the process is self-limiting, so within-wafer-uniformity is excellent. Second, the self-limiting nature of the process leads to smoothing of the surface during etching. This smoothing is particularly important for metal etch back where increases in surface roughness are detrimental to the metal's resistivity. Thirdly, the digital nature of the process allows a great deal of control over the total etch amount by varying the number of ALE cycles rather than the precise etch time.

The cyclic wet ALE process shown in FIGS. 1A-1E causes smoothing of the etched surface. Although the roughness of an incoming surface is reduced during the etch process, the amount of smoothing achieved by the cyclic wet ALE process eventually reaches a terminal value. Etching beyond this point does not improve the surface roughness any further. In one example process, the root mean square (RMS) roughness of an unetched polycrystalline cobalt material may be ~1.5 nm as deposited. The surface roughness of the polycrystalline cobalt material may be reduced to ~0.6 nm after 10 nm of cobalt is removed using the wet ALE process described above. The RMS roughness remains at ~0.6 nm during additional etching, even after 30 nm of cobalt has been removed. Thus, for the polycrystalline cobalt material described in the example ALE process mentioned above, the terminal roughness value may be seen after 10 nm of etching. Additional etch cycles do not further improve the roughness. These roughness results for cobalt are representative for wet ALE processes in general.

Throughput, and therefore process cost, is always a priority in high volume manufacturing (HVM). The economic pressure to decrease the cycle time of wet ALE processes leads to conditions where reactions times are only sufficient to drive the reactions almost to saturation, and purge times are sufficient to remove most of the excess reactants. These compromises lead to throughput improvements at the expense of uniformity and roughness.

As noted above, throughput may be improved not only by decreasing ALE cycle times, but also by increasing etch rate per ALE cycle. In the present disclosure, the etch rate per ALE cycle may be increased by reducing purge times during an initial stage of the wet ALE process. As purge times are reduced, mixing between the components of the surface modification solution and the dissolution solution allow small amounts of continuous etching during transient time windows in the etch cycle. This continuous etching increases the etch rate during the initial stage of the wet ALE process at the expense of surface roughness. Surface roughness may then be improved during later stages of the wet ALE process by increasing the purge times used in subsequent cycles of the wet ALE process. The dynamic adjustment of purge times, as the etch progresses, is particularly useful when etching nanoscale features.

A schematic of how solution mixing effects etching of nanoscale features is shown in FIGS. 2A-2B and 3A-3B. When etching nanoscale features, diffusion becomes the dominant mass transport phenomenon. The physical dimensions of the features being etched are too small to allow convective transport. In the examples shown in FIGS. 2A-2B and 3A-3B, a metal feature 200 (e.g., a cobalt feature) recessed within a surrounding dielectric layer 205 is etched by exposing a surface of the metal feature 200 to a surface modification solution 210 (e.g., citric acid in isopropyl alcohol, "IPA"), followed by a purge solution 220 (e.g., IPA) and a dissolution solution 215 (e.g., deionized water, $H_2O$).

Figure 2A:
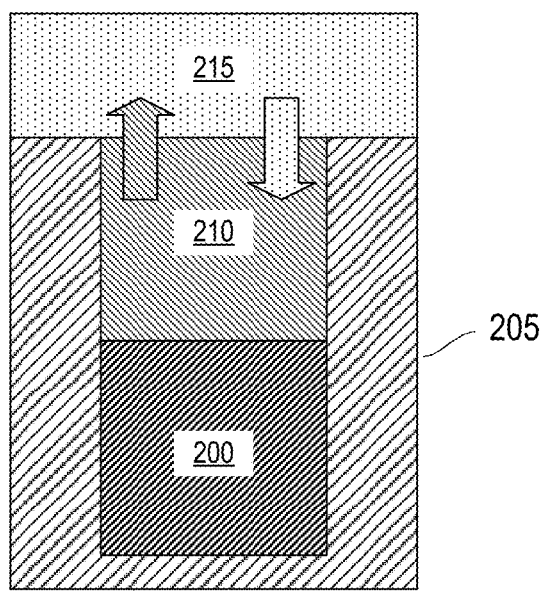
FIG. 2A illustrates a metal feature recessed within a surrounding dielectric layer, wherein the metal feature is etched by exposing a surface of the metal feature to a surface modification solution, followed by a purge solution and a dissolution solution, and the diffusional mixing that occurs when the dissolution solution is introduced before the surface modification solution has been completely removed from the surface of the metal feature.
Figure 2B:
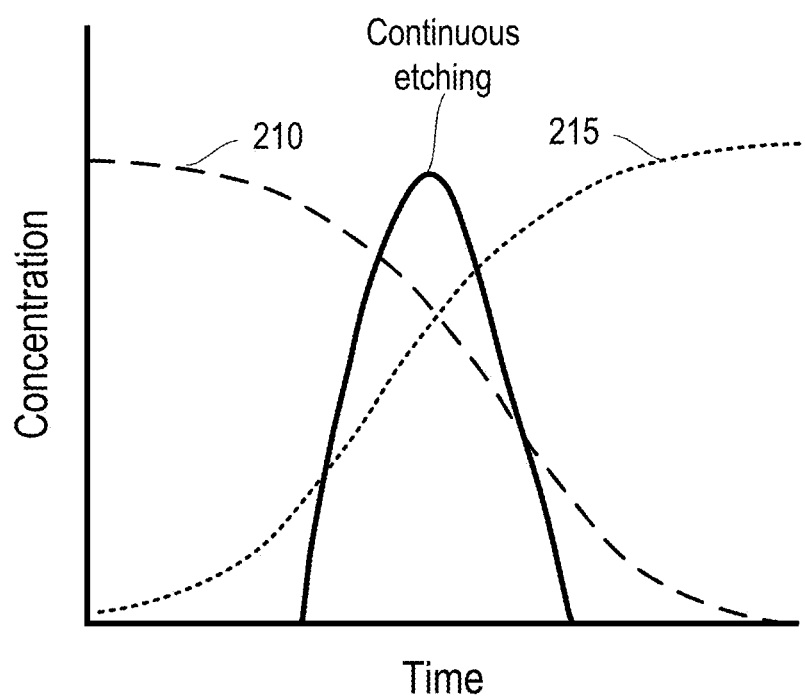
FIG. 2B is graph illustrating how the interdiffusion of the surface modification and dissolution solutions in FIG. 2A leads to continuous etching.
Figure 3A:
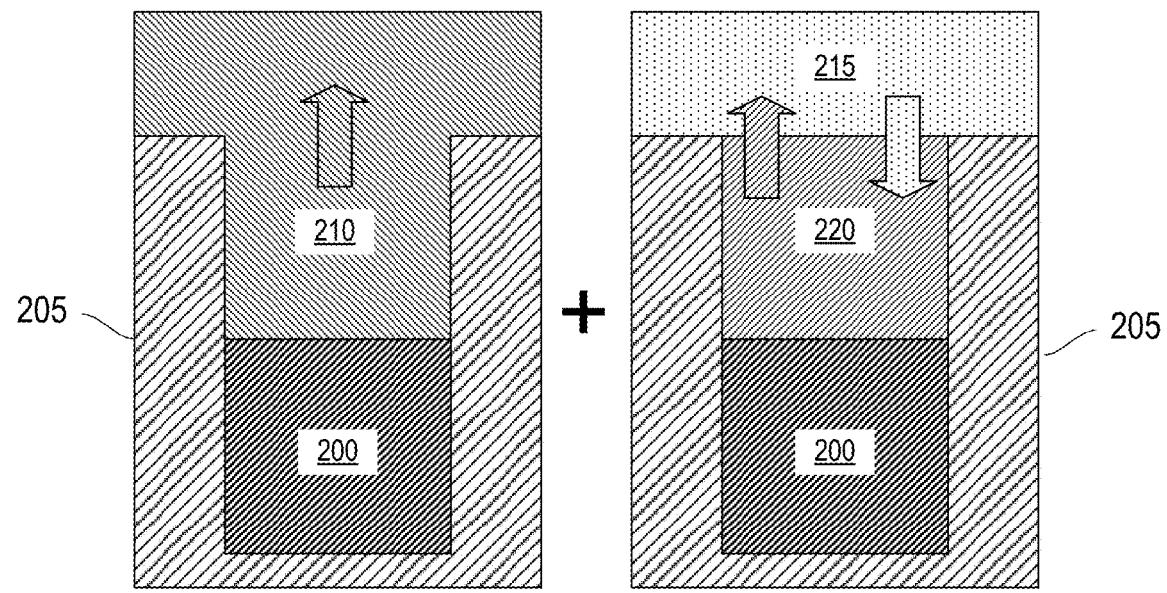
FIG. 3A illustrates a metal feature recessed within a surrounding dielectric layer, wherein the metal feature is etched by exposing a surface of the metal feature to a surface modification solution, followed by a purge solution and a dissolution solution, wherein the purge time between the surface modification step and the dissolution step is long enough to completely remove the surface modification solution before introducing the dissolution solution.
Figure 3B:
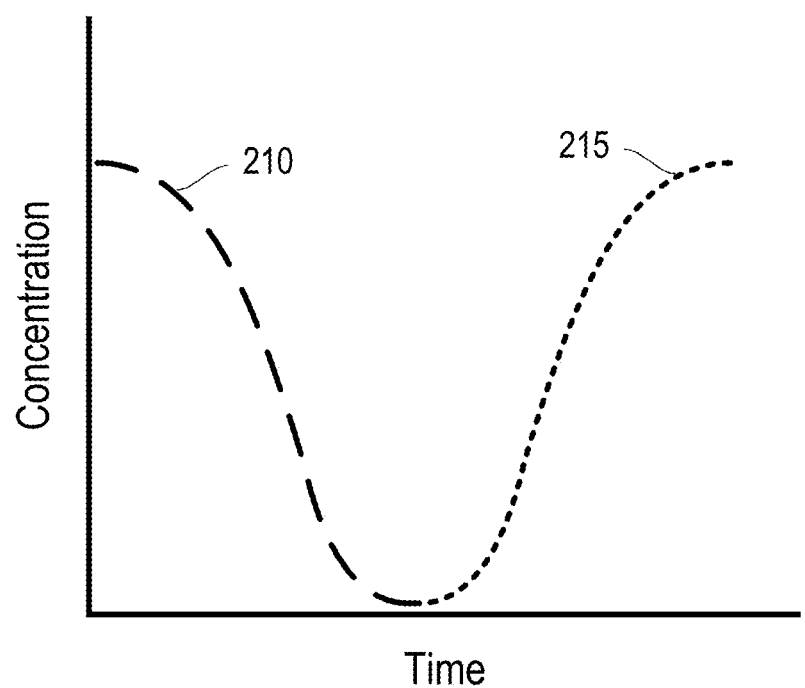
FIG. 3B is graph illustrating how inter-diffusional mixing can be eliminated, and continuous etching prevented, if the purge time is sufficient as shown in FIG. 3A.

If, as shown in the example in FIG. 2A, the dissolution solution 215 is introduced before the surface modification solution 210 has been completely removed from the surface of the metal feature 200, then interdiffusion of the two solutions (e.g., interdiffusion of citric acid in IPA and $H_2O$) will lead to conditions allowing a continuous etch process, as shown in FIG. 2B. On the other hand, FIGS. 3A-3B show that inter-diffusional mixing can be eliminated, and continuous etching prevented, if the purge time between the surface modification step and the dissolution step is long enough to completely remove the previous etch solution. Because mass transport is limited to diffusion in nanoscale features, deeper features require longer purge times to ensure complete separation of the surface modification and dissolution solutions. Dynamically increasing the purge time as the etch progresses to maintain effective purging is one aspect of the embodiments described herein.

When purge time is inadequate (see, e.g., FIGS. 2A-2B), mixing of the surface modification solution 210 and dissolution solution 215 leads to transient continuous etching. In addition to increasing the amount of material removed during each etch cycle, continuous etching also increases the roughness of the surface being etched. An example of this is shown in FIGS. 4A-4B.

Figure 4A:
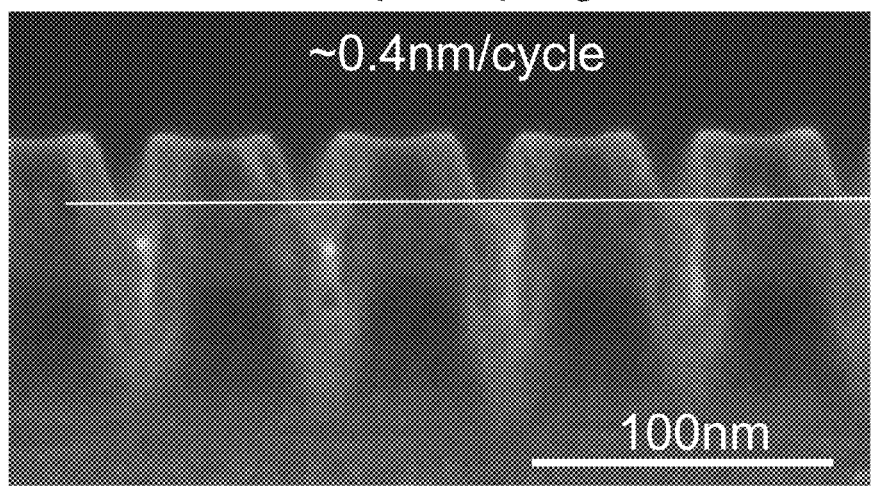
FIGS. 4A and 4B are scanning electron microscope (SEM) images of patterned metal features etched using a wet ALE process in accordance with the present disclosure.
Figure 4B:
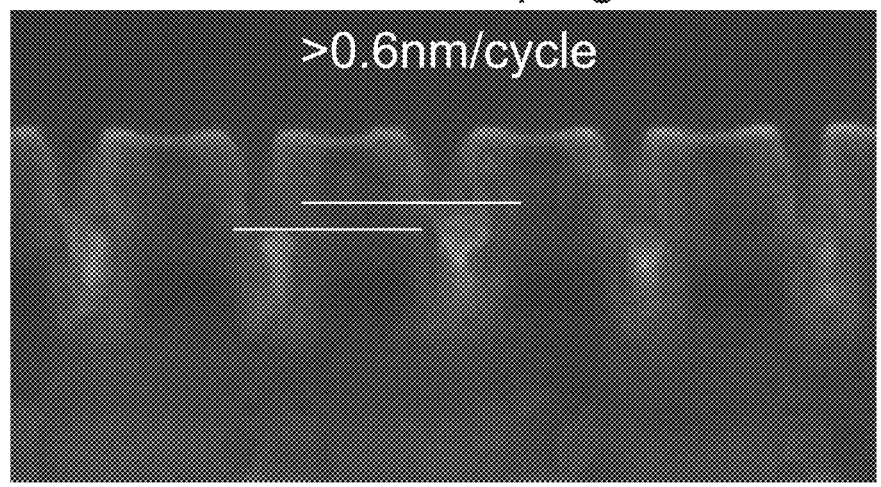

FIGS. 4A and 4B are scanning electron microscope (SEM) images of patterned cobalt features etched using a wet ALE process. In the SEM image shown in FIG. 4A, adequate purge times are used between the surface modification and dissolution steps to prevent mixing of the surface modification and dissolution solutions and avoid continuous etching. In this case, the etch amount per cycle is about 0.4 nm. FIG. 4B shows similar conditions, but with a reduced or insufficient purge time that does not prevent mixing of the surface modification and dissolution solutions. In the SEM image shown in FIG. 4B, the etch amount per cycle has increased to 0.6 nm, and the surface roughness is visibly worse. Comparing the two SEM images shows how purge time can influence etch amount per cycle and surface roughness. Intermediate purge times can also be used to balance the needs of etch rate and surface roughness.

The techniques described herein improve upon conventional wet ALE processes by providing a dynamic ALE cycle timing schedule that balances throughput and etch rate with post-etch surface roughness. In some embodiments, purge times can be dynamically adjusted to compensate for diffusion-controlled aspect ratio dependence of the etch process. When wet ALE is us used as a recess etch, for example, purge times may be adjusted during the etch process to compensate for changes in aspect ratio. At the beginning of the etch process, the aspect ratio of the etch profile is zero. As metal is removed from exposed surfaces, the aspect ratio of the recess (or another feature) increases and reaches a maximum when the etch reaches its endpoint. Because the chance of solutions mixing is lower in low aspect ratio features, purge times can be shorter at the beginning of the etch process to increase etch rate. As the etch progresses and the aspect ratio increases, the purge times between the surface modification and dissolution steps can be dynamically increased to maintain adequate separation of the etch solutions and to improve surface roughness by avoiding continuous etching in the final stages of the etch. This dynamic change in purge timing is another aspect of the embodiments described herein.

Figure 5A:
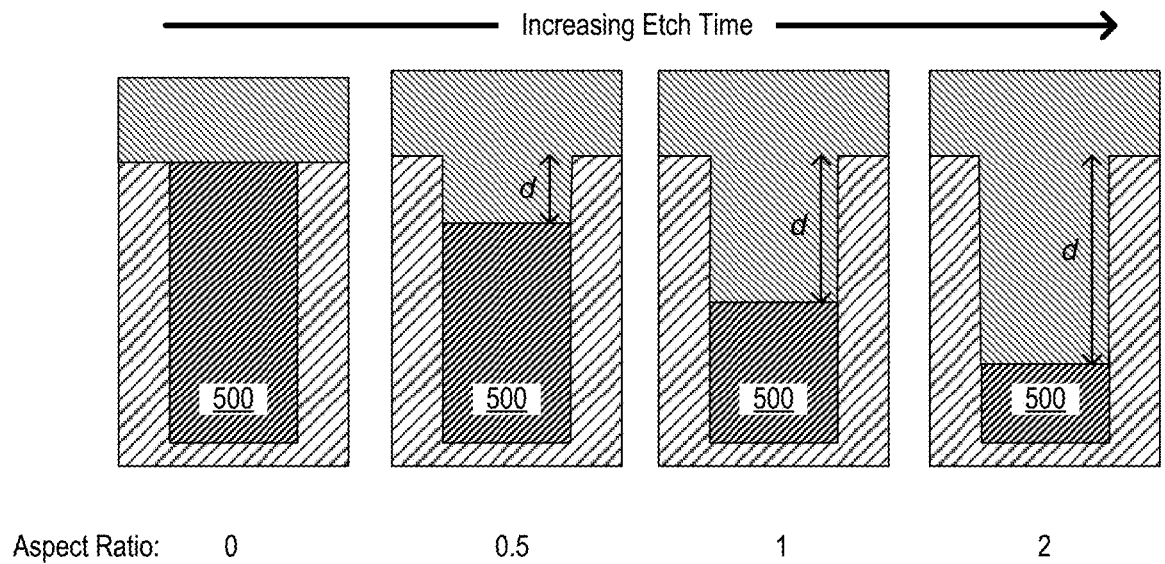
FIG. 5A illustrates the relationship between etch time, aspect ratio, and diffusion timescale when a wet ALE process in accordance with the present disclosure is used to etch a feature within a substrate.
Figure 5B:
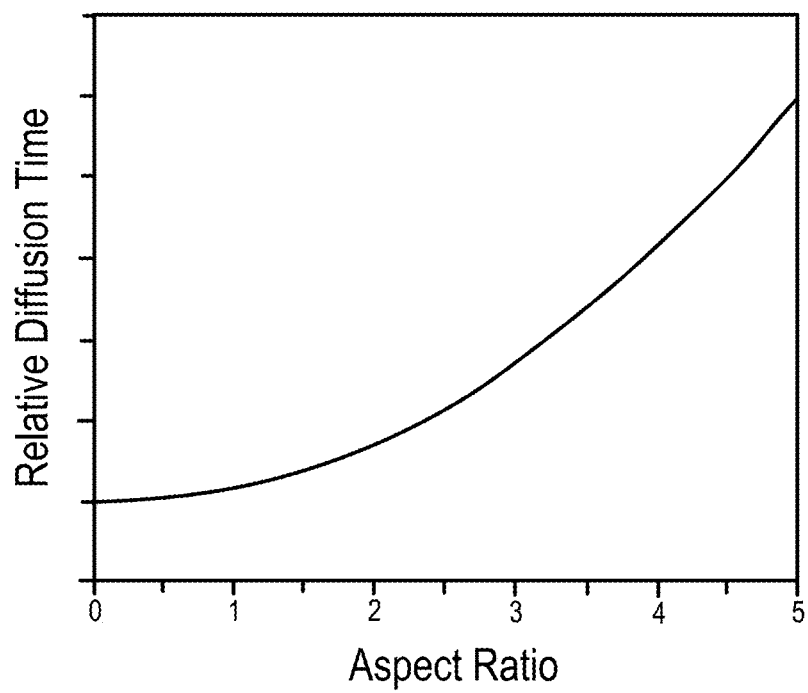
FIG. 5B is a graph illustrating relative diffusion time vs aspect ratio.

FIGS. 5A and 5B illustrate details of the relationship between etch time, aspect ratio, and diffusion timescale. The diffusion length (d) can be defined as the depth of a feature 500 being etched (e.g., a polycrystalline metal feature). Convective transport dominates above the wafer surface, so diffusion is only important in the nanoscale features between this convective zone and the metal surface. As the depth of these features increases, so does the diffusion length (d). The increase in diffusion length (d) as the etch process progresses is shown in FIG. 5A.

FIG. 5B is a graph illustrating relative diffusion time vs aspect ratio. As shown in FIG. 5B, the diffusion timescale increases proportionally to the square of the aspect ratio or diffusion length (d). For typical liquid-phase diffusion coefficients, and typical semiconductor length scales, the diffusion timescales are less than a second. But purge times multiple times longer than the diffusion timescales are needed to completely remove all reactants. Even so, the required purge times are compatible with semiconductor HVM requirements.

In some embodiments, purge times can be dynamically adjusted to increase the etch rate during an initial stage of a wet ALE process, and decrease the etch rate during a final stage of the wet ALE process. For example, purge times can be relatively short (or be eliminated altogether) at the beginning of the etch process, or throughout the process, depending on the roughness requirements of the post-etch surface. Reducing purge timing during an initial stage of the wet ALE process allows some degree of mixing between the surface modification and dissolution solutions on the wafer surface. The mixing leads to transient continuous etching, and thus, faster etch rate and larger etch amounts per etch cycle. As noted above, however, continuous etching also increases surface roughness. As the etch progresses, the purge timing can be increased during intermediate and/or final stages of the wet ALE process to decrease the etch rate and the etch amount per cycle, while improving the roughness of the surface being etched. A schematic of this dynamic purge timing is shown in FIG. 6A with the results of such timing shown in FIGS. 6B-6E.

Figure 6A:
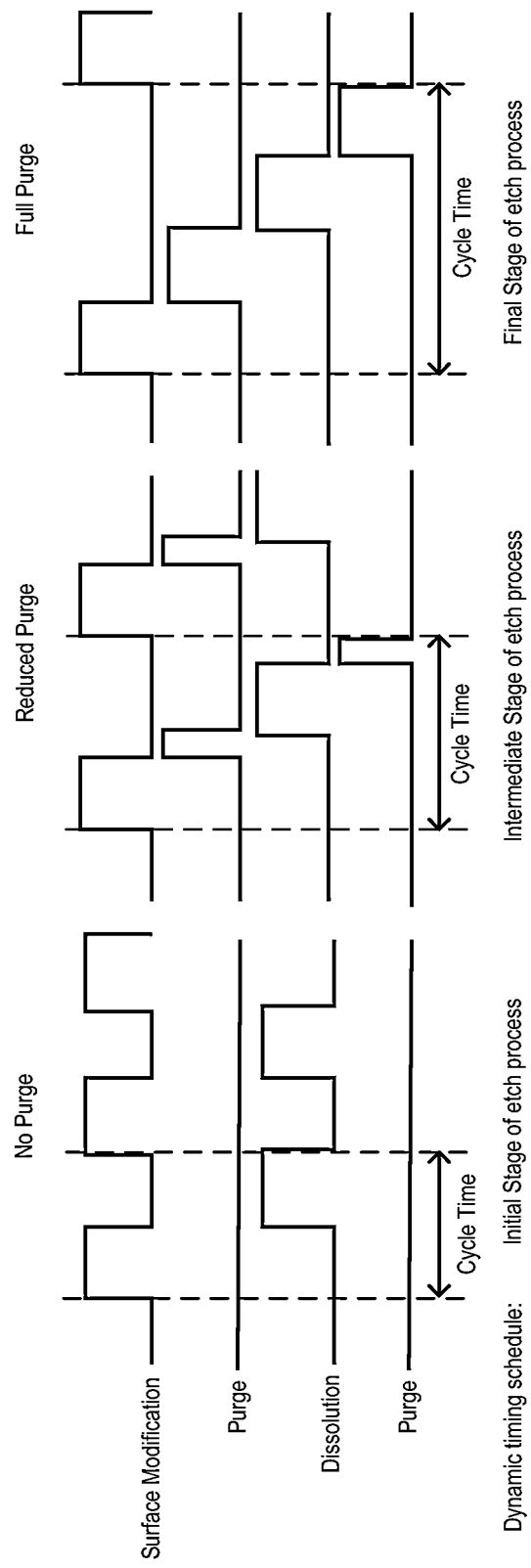
FIG. 6A is a timing diagram illustrating one embodiment of a dynamic wet ALE cycle timing schedule that dynamically adjusts purge times to increase the etch rate during an initial stage of a wet ALE process and decrease the etch rate during latter stages of the wet ALE process to balance throughput and etch rate with post-etch surface roughness.
Figure 6B:
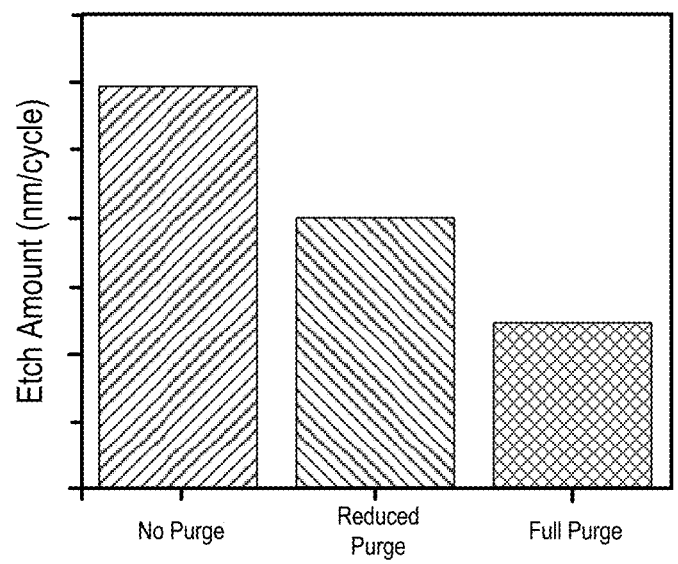
FIG. 6B is a graph depicting the expected etch amount per cycle for the different purge conditions shown in FIG. 6A.

The dispense timing for different purge conditions (e.g., no purge, reduced purge and full purge) is shown schematically in FIG. 6A. As shown in FIG. 6A, the cycle time increases substantially as the purge time is increased. Although increasing purge time (and thus, the cycle time) improves surface roughness by reducing the chance of continuous etching, it does so at the expense of throughput. FIG. 6B shows the expected etch amount per cycle (nm/cycle) for the different purge conditions shown in FIG. 6A. As shown in FIG. 6B, the etch amount (and the etch rate) per cycle increases with reduced purge time and decreases with increased purge time. Although increasing the etch amount (and the etch rate) per cycle improves throughput, it does so at the expense of surface roughness.

In some embodiments, a dynamic purge may be used to balance throughput and etch rate with post-etch surface roughness. FIG. 6A illustrates one embodiment of a dynamic wet ALE cycle timing schedule that uses a "dynamic purge" (i.e., dynamically changing purge timing) during a single etch to balance throughput and etch rate with post-etch surface roughness. In the embodiment shown in FIG. 6A, the etch process begins with no purging between the surface modification and dissolution steps to prioritize a fast etch rate, and the purge times increase as the etch progresses to prioritize a smoother post-etch surface as the etch nears completion. More specifically, the purge between the surface modification and dissolution steps is eliminated ("no purge") during an initial stage of the etch process, reduced ("reduced purge") during an intermediate stage of the etch process, and complete ("full purge") during a final stage of the etch process in the embodiment shown in FIG. 6A. Each stage shown in FIG. 6A may generally include one or more ALE cycles.

Figure 6C:
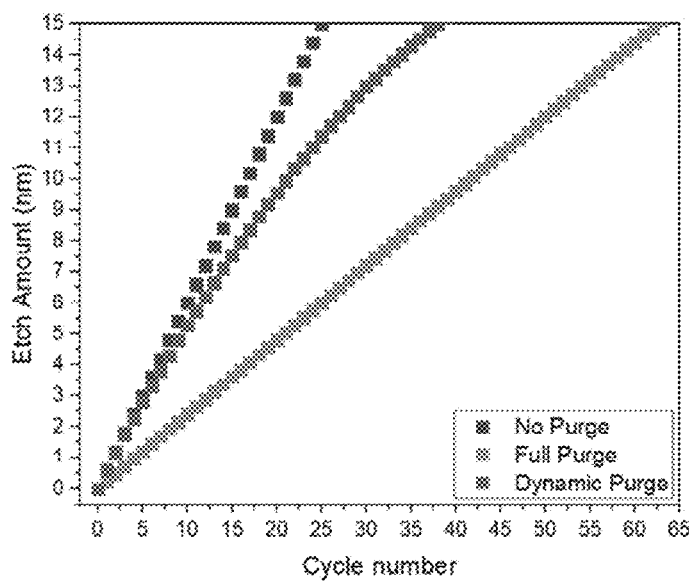
FIG. 6C is a graph illustrating example etch amounts (nm) that may be achieved with no purge, a full purge and a dynamic purge as a function of cycle number.
Figure 6D:
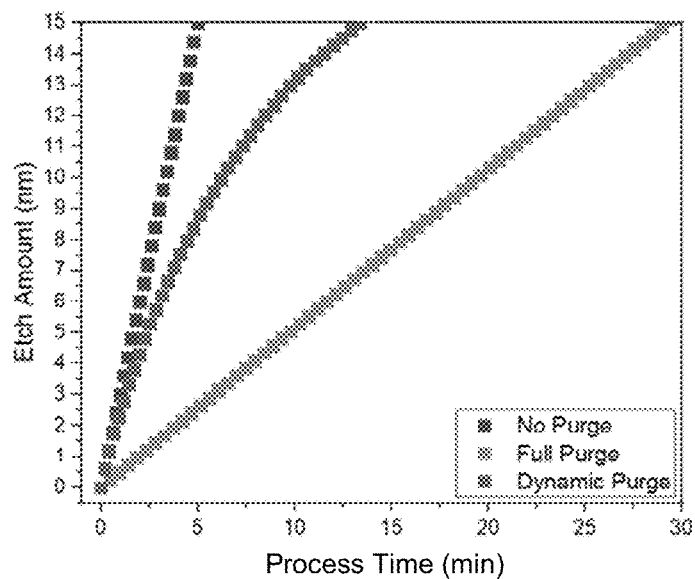
FIG. 6D is a graph illustrating example etch amounts (nm) that may be achieved with no purge, a full purge and a dynamic purge as a function of process time.

FIGS. 6C and 6D show simulated etching results that may be achieved with different purge conditions, including no purge, a full purge and a dynamic purge, as described above and shown in FIG. 6A. In particular, FIGS. 6C and 6D illustrate example etch amounts (nm) that may be achieved with no purge, a full purge and a dynamic purge as a function of cycle number (FIG. 6C) and process time (FIG. 6D). As such, FIGS. 6C and 6D illustrate that dynamically changing purge conditions can be used to increase etch productivity using the techniques described herein.

Figure 6E:
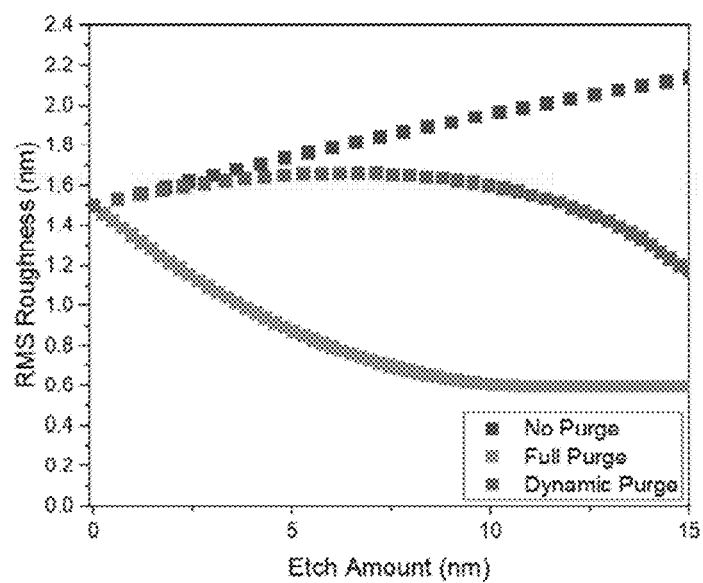
FIG. 6E illustrates the root mean square (RMS) roughness (nm) of post-etched surfaces etched using no purge, a full purge and a dynamic purge, as shown schematically in FIG. 6A.

FIG. 6E illustrates the RMS roughness (nm) of post-etched surfaces etched using no purge, a full purge and a dynamic purge, as shown schematically in FIG. 6A. As shown in FIG. 6E, removing the purge steps between the surface modification and dissolution steps ("no purge") significantly increases the etch amount and the etch productivity at the expense of surface roughness. On the other hand, FIG. 6E shows that surface roughness is minimized with the full purge, but comes at the expense of etch amount and throughput. By dynamically changing the purge time, as shown for example in FIG. 6A, the etch rate is high at the beginning of the etch process (e.g., during the initial stage of the etch process) and slows as the endpoint of the etch process nears. This "dynamic purge" causes the surface roughness to increase at the beginning of the etch, and improve as the purge time is increased during the intermediate and final stages of the etch process. While an example recipe is shown in FIG. 6A, a particular recipe for how the purge time changes as the etch progresses may be experimentally determined to balance the competing needs for smooth post-etch surface and high process throughput.

The following is an example of how the dynamic purge timing techniques described herein can be applied to a metal recess etch. For a metal recess etch process with constant purge timing, the degree of diffusional mixing is expected to increase as the etch progresses. The diffusional mixing increases because the diffusion length (d) is increasing without a corresponding increase in purge time. This leads to conditions favorable to grain boundary etching and increased surface roughness at the end of the etch. It also leads to increased etch amounts per cycle near the end of the etch.

The dynamic dispense timing (i.e., dynamic purge timing) techniques described herein can be used in an alternative etch scheme that improves the post etch surface roughness without increasing the process time. For example, using the dynamic purge timing techniques described herein, purge times can be reduced at the start of the etch process when diffusion lengths (d) are low. In some cases, continuous etching may occur if the purge times are reduced aggressively. This leads to higher etch amounts per cycle and some roughness generation. The purge times can then be increased as the etch progresses. This prevents continuous etching and improves the surface roughness towards the end of the etch process. This etch scheme starts with faster etch rates where roughness can be generated and finishes with conditions that favor slower rates and smoothing of the surface. Thus, the dynamic purge timing techniques described herein can be used to improve post-etch roughness without increasing etch time.

The dynamic purge timing techniques described herein may generally be used to etch a wide variety of materials and features using a wide variety of wet ALE process conditions. One application of the dynamic purge timing techniques described herein may be for etching metal surfaces during a recess etch for fully self-aligned vias. For example, the techniques described herein may be used to etch metal-filled trenches in a dielectric material. In one exemplary application, the trench may be filled with a polycrystalline cobalt material or another transition metal. When metal-filled trenches are etched in a dielectric material, the exposed surfaces of the metal must be selectively etched without increasing the surface roughness of the metal. It will be recognized that such an application is merely exemplary, and the techniques described herein may be used for many other applications.

In some embodiments, a wet ALE process as described herein can be carried out in a spin chamber, where the substrate is rotated while etch solutions are dispensed onto the substrate surface. The motion of the substrate distributes the etchants evenly over the substrate surface. The dispense time for each etchant (e.g., each surface modification solution and dissolution solution) must be long enough so that the self-limiting reaction thickness is achieved over the entire substrate surface. The chemical being dispensed can be switched between etch components to accomplish the desired etching. In some embodiments, a purge solution may be dispensed in between the surface modification and dissolution solutions for an adequate amount of purge time to prevent spontaneous etching of the metal surface due to transient mixing of the surface modification and dissolution solutions. In other embodiments, the purge time between the surface modification and dissolution steps may be reduced, eliminated or dynamically adjusted as the etch progresses to provide a desired throughput, etch rate and/or post-etch surface roughness in the wet ALE process. A single etch cycle, defined by surface modification (e.g., oxidation/complexation) followed by dissolution of the modified surface layer, can be repeated until an appropriate amount of material is removed.

Figure 7A:
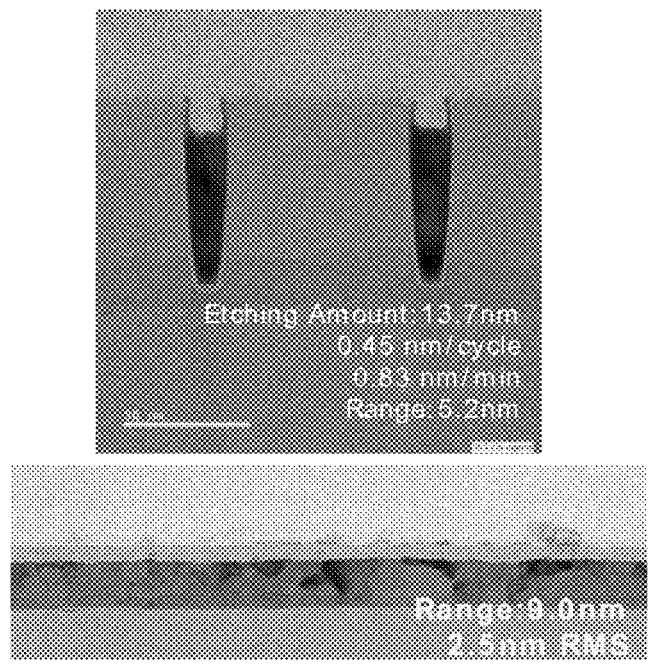
FIGS. 7A and 7B provide transmission electron microscopy (TEM) images of cobalt features etched using the wet ALE process conditions detailed in Table 1.
Figure 7B:
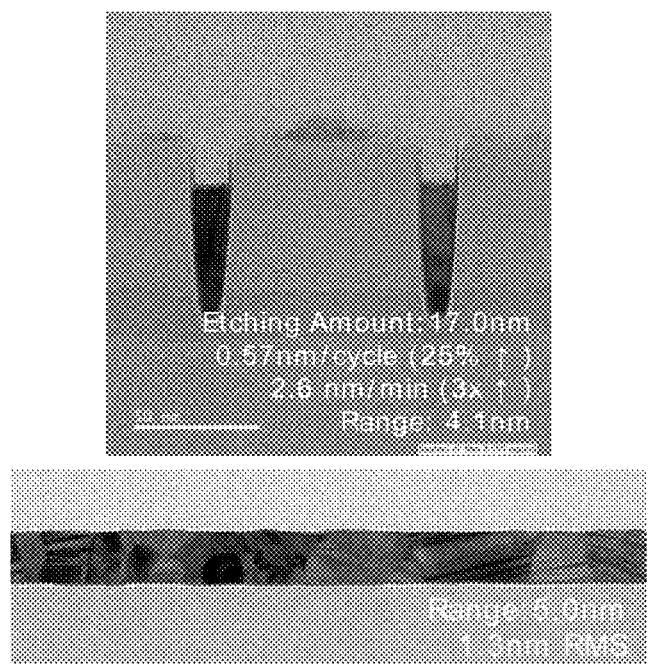

Table 1 illustrates example wet ALE process conditions that may be used for etching the cobalt features shown in FIGS. 7A and 7B using a spin chamber. It will be recognized that the use of a spin chamber is merely one embodiment, and a wide variety of differing process tools may be used to perform the techniques described herein. As one alternative, for example, the substrate could be dipped in chemical baths containing the etchants. In some cases, the substrate can be sequentially immersed in baths of each etchant in order with intermediate rinse baths to prevent cross contamination of the chemicals. This process can be repeated until an appropriate amount of material is removed. In yet another embodiment, the process may be utilized with aerosol sprays, fogs or mists of each reactant. Further, it will be recognized that a combination of the various described tools for applying the reactants may be used, even within one cycle of the process.

As shown in Table 1, the wet ALE process used to etch the cobalt features shown in FIGS. 7A and 7B may generally begin by exposing the surface of the cobalt features to isopropyl alcohol (IPA) and a complexing agent (e.g., a carboxylate-based ligand) in a surface modification step. Next, the wet ALE process may perform a first purge ("Purge 1"), expose the surface of the cobalt features to deionized water in a dissolution step and perform a second purge ("Purge 2"). The surface modification step, the first purge, the dissolution step and the second purge may be performed using a wide variety of tool settings, including but not limited to, spin speed, flow rate, number of cycles, cycle time, etc. In Table 1, the surface modification step and the first purge are performed at a spin speed of 1000 rpm and a flow rate of 300 ml/min, the dissolution step is performed at a spin speed of 1000 rpm and a flow rate of 1500 ml/min and the second purge is performed at a spin speed of 1000 rpm and a flow rate of 0 ml/min (i.e., the second purge is a dry purge). The surface modification step, the first purge, the dissolution step and the second purge are repeated for 30 cycles in the wet ALE process shown in Table 1.

TABLE 1

| Step | Tool Settings | | Baseline Purge | Reduced Purge |
| --- | --- | --- | --- | --- |
| | Spin speed (rpm) | Flow rate (ml/min) | Time (sec) | |
| IPA + ligand | 1000 | 300 | 3 | 3 |
| Purge 1 | 1000 | 300 | 10 | 5 |
| Deionized Water | 1000 | 1500 | 5 | 5 |
| Purge 2 | 1000 | — | 10 | 0 |
| | | Cycles | 30 | 30 |
| | | Total Time | 16.5 min | 6.5 min |

In addition to the exemplary process conditions described above, Table 1 compares the total etch time ("Total Time") achieved when etching the cobalt features shown in FIGS. 7A and 7B using a full purge ("Baseline Purge") and a dynamically adjusted purge ("Reduced Purge"). In the full purge ("Baseline Purge") case, the first and second purge steps ("Purge 1" and "Purge 2") are each performed for 10 seconds to prevent mixing of the surface modification and dissolution solutions. In the dynamically adjusted purge ("Reduced Purge") case, the first purge step ("Purge 1") is reduced by 50% (i.e., 5 seconds) compared to the full purge ("Baseline Purge"), and the second purge step ("Purge 2") is eliminated, during each cycle of the wet ALE process. Table 1 shows that in moving from the full purge ("Baseline Purge") case to the dynamically adjusted purge ("Reduced Purge") case, the time per cycle is reduced by more than 50%. While this leads to a faster wet ALE process, it is the combination of the faster cycle time and the 25% increase in etch amount per cycle that leads to the total 3× improvement in etch productivity.

FIGS. 7A and 7B provide transmission electron microscopy (TEM) images of cobalt features etched using the wet ALE process conditions detailed in Table 1. FIG. 7A illustrates the full purge ("Baseline Purge") case with complete separation between surface modification and dissolution solutions. The etch amount per cycle is about 0.45 nm and the etch rate is 0.83 nm/min when a full purge is used as shown in Table 1. When the first purge step is reduced and the second purge step is removed, as shown in Table 1 for the dynamically adjusted purge ("Reduced Purge") case, the etch amount per cycle increases to 0.57 nm and the etch rate increases to 2.6 nm/min. This represents a 3× improvement in etch rate over the full purge ("Baseline Purge") case. In the examples shown in FIGS. 7A and 7B, the surface roughness is good in both the full purge ("Baseline Purge") case and the dynamically adjusted purge ("Reduced Purge") purge case, so dynamic changes to the purge timing as the etch progresses is not necessary.

The dynamic adjusting of purge timing during the etch provides another tool for optimizing wet etch performance. Completely removing the purge step can be used to significantly improve throughput if surface roughness is not a priority. If minimizing surface roughness is the priority, a dynamic purge timing strategy can be used where purge times are increased as the etch progresses. In this scenario, etch speed is prioritized at the beginning of the etch, while smoothness is prioritized at the end. By using this strategy, throughput can be increased while maintaining good post-etch surface roughness. As such, the embodiments described herein provide a new tool to increase the total etch productivity, while balancing the need for post-etch surface roughness. Chemical consumption may also be reduced as the etch time is reduced, so total cost of ownership for the process is improved as well.

Figure 8:
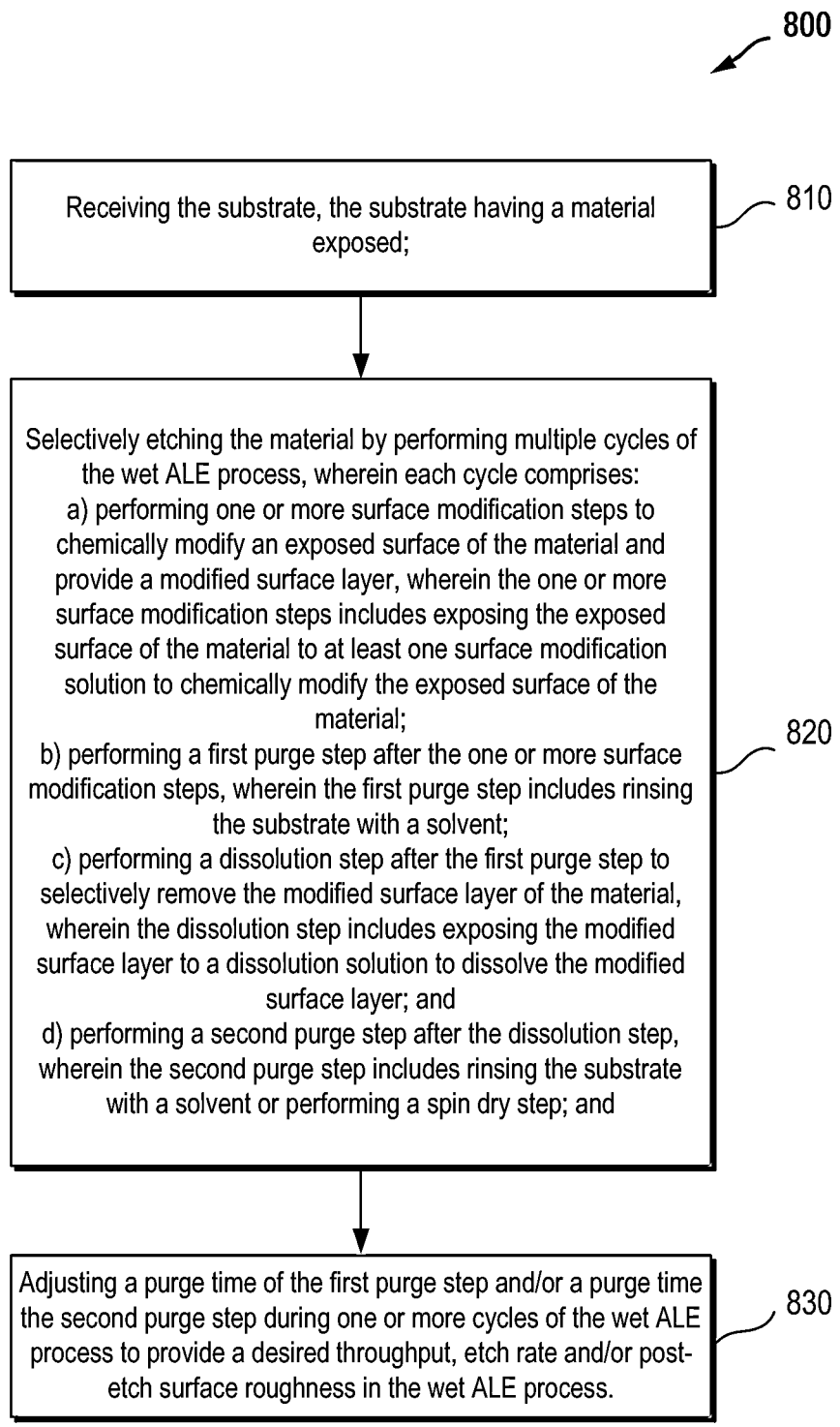
FIG. 8 is a flowchart diagram illustrating one embodiment of a method utilizing the techniques described herein.
Figure 9:
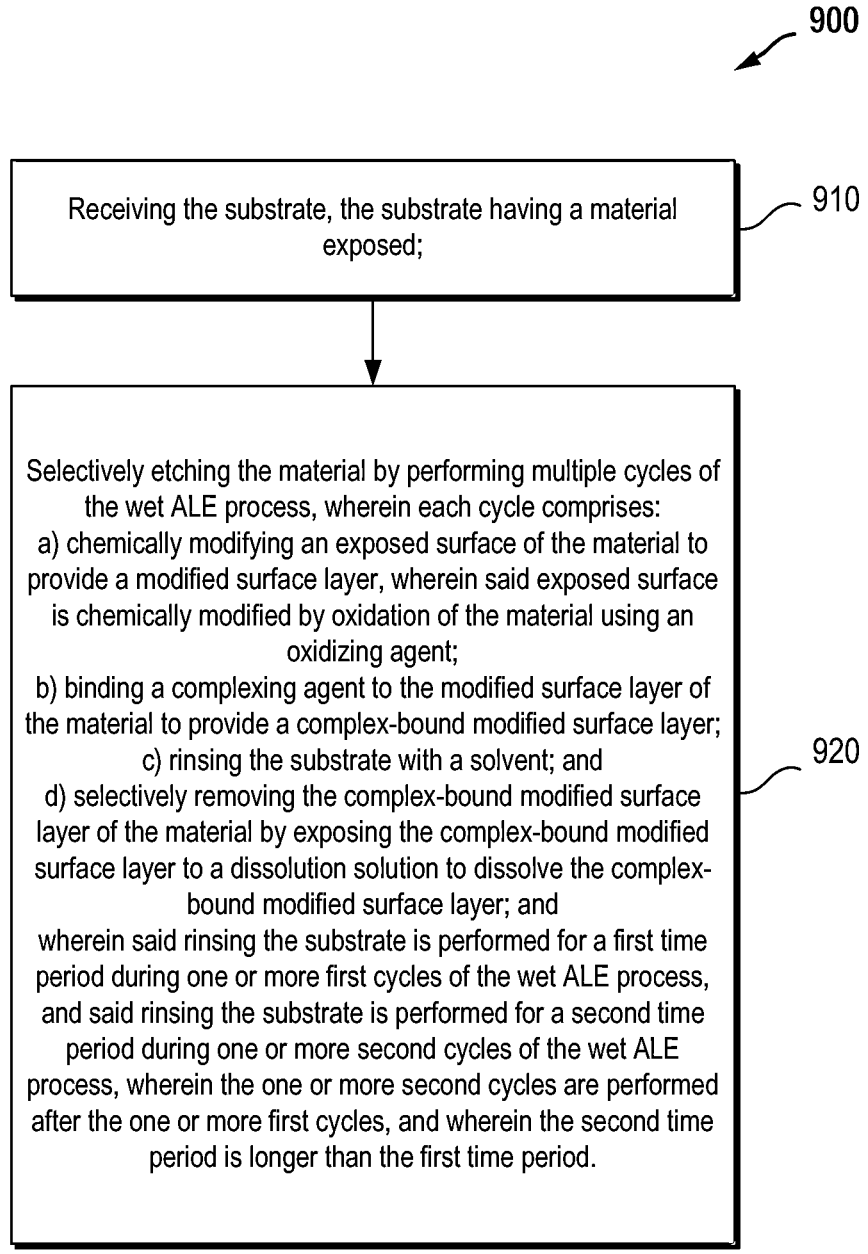
FIG. 9 is a flowchart diagram illustrating another embodiment of a method utilizing the techniques described herein.
Figure 10:
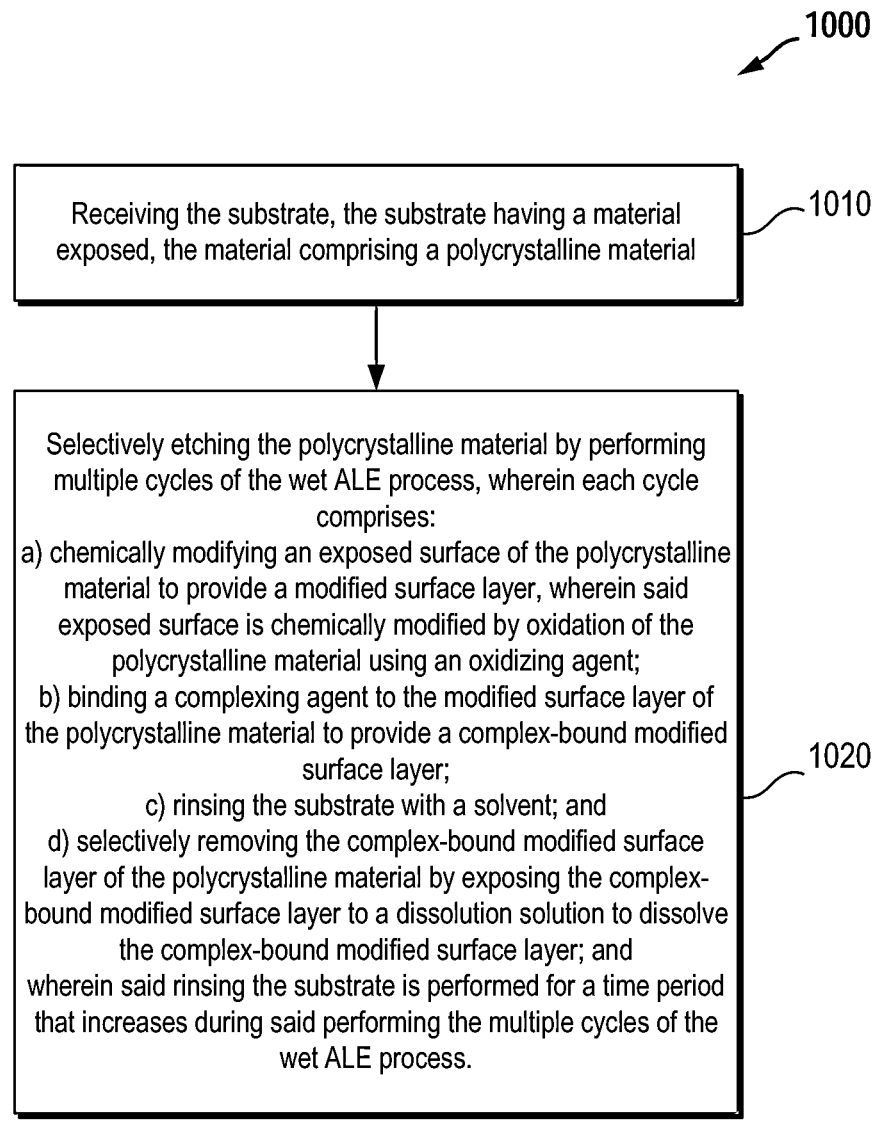
FIG. 10 is a flowchart diagram illustrating another embodiment of a method utilizing the techniques described herein.

FIGS. 8-10 illustrate exemplary methods that use the processing techniques described herein. More specifically, FIGS. 8-10 illustrate various embodiments of methods that improve a wet ALE process by providing a dynamic ALE cycle timing schedule that balances throughput and etch rate with post-etch surface roughness. As described in more detail below, the methods shown in FIGS. 8-10 may adjust the purge timing between ALE cycles and/or between individual surface modification and selective dissolution steps to provide a desired throughput, etch rate and/or post-etch surface roughness in an improved wet ALE process.

It will be recognized that the embodiments of FIGS. 8-10 are merely exemplary and additional methods may utilize the techniques described herein. Further, additional processing steps may be added to the methods shown in the FIGS. 8-10 as the steps described are not intended to be exclusive. Moreover, the order of the steps is not limited to the order shown in the figures as different orders may occur and/or various steps may be performed in combination or at the same time.

FIG. 8 illustrates one embodiment of a method 800 that may be used for etching a substrate using a wet atomic layer etching (ALE) process. The method 800 shown in FIG. 8 comprises receiving the substrate, the substrate having a material exposed (in step 810). Then, in step 820, the method 800 includes selectively etching the material by performing multiple cycles of the wet ALE process, wherein each cycle comprises: (a) performing one or more surface modification steps to chemically modify an exposed surface of the material and provide a modified surface layer, wherein the one or more surface modification steps includes exposing the exposed surface of the material to at least one surface modification solution to chemically modify the exposed surface of the material; (b) performing a first purge step after the one or more surface modification steps, wherein the first purge step includes rinsing the substrate with a solvent; (c) performing a dissolution step after the first purge step to selectively remove the modified surface layer of the material, wherein the dissolution step includes exposing the modified surface layer to a dissolution solution to dissolve the modified surface layer; and (d) performing a second purge step after the dissolution step, wherein the second purge step includes rinsing the substrate with a solvent or performing a spin dry step. In step 830, the method 800 includes adjusting a purge time of the first purge step and/or a purge time the second purge step during one or more cycles of the wet ALE process to provide a desired throughput, etch rate and/or post-etch surface roughness in the wet ALE process.

FIG. 9 illustrates another embodiment of a method 900 that may be used for etching a substrate. The method 900 shown in FIG. 9 comprises receiving the substrate, the substrate having a material exposed (in step 910). Then, in step 920, the method 900 includes selectively etching the material by performing multiple cycles of the wet ALE process, wherein each cycle comprises: (a) chemically modifying an exposed surface of the material to provide a modified surface layer, wherein said exposed surface is chemically modified by oxidation of the material using an oxidizing agent; (b) binding a complexing agent to the modified surface layer of the material to provide a complex-bound modified surface layer; (c) rinsing the substrate with a solvent; and (d) selectively removing the complex-bound modified surface layer of the material by exposing the complex-bound modified surface layer to a dissolution solution to dissolve the complex-bound modified surface layer. In the method 900 shown in FIG. 9, the rinsing step (c) is performed for: a first time period during one or more first cycles of the wet ALE process, and a second time period during one or more second cycles of the wet ALE process, wherein the one or more second cycles are performed after the one or more first cycles, and wherein the second time period is longer than the first time period.

FIG. 10 illustrates another embodiment of a method 1000 that may be used for etching a substrate. The method 1000 shown in FIG. 10 comprises receiving the substrate, the substrate having a material exposed, the material comprising a polycrystalline material (in step 1010). Then, in step 1020, the method 1000 includes selectively etching the polycrystalline material by performing multiple cycles of the wet ALE process, wherein each cycle comprises: (a) chemically modifying an exposed surface of the polycrystalline material to provide a modified surface layer, wherein said exposed surface is chemically modified by oxidation of the polycrystalline material using an oxidizing agent; (b) binding a complexing agent to the modified surface layer of the polycrystalline material to provide a complex-bound modified surface layer; (c) rinsing the substrate with a solvent; and (d) selectively removing the complex-bound modified surface layer of the polycrystalline material by exposing the complex-bound modified surface layer to a dissolution solution to dissolve the complex-bound modified surface layer. In the method 1000 shown in FIG. 10, the rinsing step (c) is performed for a time period that increases during said performing the multiple cycles of the wet ALE process.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the wet ALE techniques are described herein with reference to specific embodiments, various modifications and changes can be made without departing from the scope of the present disclosure. Accordingly, the specification and figures are to be regarded in an illustrative rather than a restrictive sense, and such modifications are intended to be included within the scope of the present disclosure. Further, any benefits, advantages, or solutions to problems that are described herein with regard to specific embodiments are not intended to be construed as a critical, required, or essential feature or element of any or all the claims.

What is claimed is:

1. A method of etching a substrate using a wet atomic layer etching (ALE) process, the method comprising:
    receiving the substrate, the substrate having a material exposed; and
    selectively etching the material by performing multiple cycles of the wet ALE process, wherein each cycle comprises:
        a) performing one or more surface modification steps to chemically modify an exposed surface of the material and provide a modified surface layer, wherein the one or more surface modification steps includes exposing the exposed surface of the material to at least one surface modification solution to chemically modify the exposed surface of the material;
        b) performing a first purge step after the one or more surface modification steps, wherein the first purge step includes rinsing the substrate with a solvent;
        c) performing a dissolution step after the first purge step to selectively remove the modified surface layer of the material, wherein the dissolution step includes exposing the modified surface layer to a dissolution solution to dissolve the modified surface layer; and
        d) performing a second purge step after the dissolution step, wherein the second purge step includes rinsing the substrate with a solvent or performing a spin dry step; and
    adjusting a purge time of the first purge step and/or a purge time of the second purge step during one or more cycles of the wet ALE process to provide a desired throughput, etch rate and/or post-etch surface roughness in the wet ALE process.

2. The method of claim 1, wherein said performing one or more surface modification steps comprises:
    exposing the exposed surface of the material to an oxidizing agent in a first surface modification step to chemically modify the exposed surface of the material and provide the modified surface layer; and
    exposing the modified surface layer to a complexing agent in a second surface modification step to bind the complexing agent to the modified surface layer and provide a complex-bound modified surface layer; and
    wherein said performing the dissolution step comprises selectively removing the complex-bound modified surface layer of the material by exposing the complex-bound modified surface layer to the dissolution solution to dissolve the complex-bound modified surface layer.

3. The method of claim 2, wherein said exposing the complex-bound modified surface layer to the dissolution solution dissolves the complex-bound modified surface layer and reforms a modified surface layer on newly exposed surfaces of the material.

4. The method of claim 1, wherein said adjusting the purge time of the first purge step and/or the purge time of the second purge step comprises increasing the purge time of the first purge step and/or the purge time of the second purge step as the wet ALE process progresses.

5. The method of claim 1, wherein said adjusting the purge time of the first purge step and/or the purge time of the second purge step comprises:
    reducing the purge time of the first purge step and/or the purge time of the second purge step during one or more first cycles of the wet ALE process to increase the etch rate achieved during the one or more first cycles; and
    increasing the purge time of the first purge step and/or the purge time of the second purge step during one or more second cycles of the wet ALE process to reduce the post-etch surface roughness achieved during the one or more second cycles, wherein the one or more second cycles are performed after the one or more first cycles.

6. The method of claim 1, wherein said adjusting the purge time of the first purge step and/or the purge time of the second purge step comprises reducing the purge time of the first purge step and eliminating the second purge step during each cycle of the wet ALE process to increase the etch rate and improve the throughput.

7. The method of claim 1, wherein said adjusting the purge time of the first purge step and/or the purge time of the second purge step comprises:
eliminating the first purge step and/or the second purge step during one or more first cycles of the wet ALE process;
performing the first purge step and/or the second purge step during one or more second cycles of the wet ALE process, wherein the one or more second cycles are performed after the one or more first cycles, and wherein the purge time of the first purge step and/or the purge time of the second purge step performed during the one or more second cycles is insufficient to prevent mixing between the at least one surface modification solution and the dissolution solution; and
performing the first purge step and/or the second purge step during one or more third cycles of the wet ALE process, wherein the one or more third cycles are performed after the one or more second cycles, and wherein the purge time of the first purge step and/or the purge time of the second purge step performed during the one or more third cycles prevents mixing between the at least one surface modification solution and the dissolution solution.

8. A method of etching a substrate using a wet atomic layer etching (ALE) process, the method comprising:
receiving the substrate, the substrate having a material exposed; and
selectively etching the material by performing multiple cycles of the wet ALE process, wherein each cycle comprises:
a) chemically modifying an exposed surface of the material to provide a modified surface layer, wherein said exposed surface is chemically modified by oxidation of the material using an oxidizing agent;
b) binding a complexing agent to the modified surface layer of the material to provide a complex-bound modified surface layer;
c) rinsing the substrate with a solvent; and
d) selectively removing the complex-bound modified surface layer of the material by exposing the complex-bound modified surface layer to a dissolution solution to dissolve the complex-bound modified surface layer; and
wherein said rinsing the substrate is performed for a first time period during one or more first cycles of the wet ALE process, and said rinsing the substrate is performed for a second time period during one or more second cycles of the wet ALE process, wherein the one or more second cycles are performed after the one or more first cycles, and wherein the second time period is longer than the first time period.

9. The method of claim 8, wherein during each cycle, a) and b) are performed with at least partial temporal overlap.

10. The method of claim 8, wherein during each cycle, a) and b) are performed sequentially with no temporal overlap.

11. The method of claim 8, wherein during each cycle, b) and d) are performed with at least partial temporal overlap.

12. The method of claim 8, wherein the exposed surface of the material has a surface roughness characterized by a first surface roughness value after the one or more first cycles, and the surface roughness is reduced to a second surface roughness after the one or more second cycles.

13. The method of claim 8, wherein the material is a transition metal.

14. The method of claim 8, wherein the material comprises copper (Cu), ruthenium (Ru) or cobalt (Co).

15. A method of etching a substrate using a wet atomic layer etching (ALE) process, the method comprising:
receiving the substrate, the substrate having a material exposed, the material comprising a polycrystalline material; and
selectively etching the polycrystalline material by performing multiple cycles of the wet ALE process, wherein each cycle comprises:
a) chemically modifying an exposed surface of the polycrystalline material to provide a modified surface layer, wherein said exposed surface is chemically modified by oxidation of the polycrystalline material using an oxidizing agent;
b) binding a complexing agent to the modified surface layer of the polycrystalline material to provide a complex-bound modified surface layer;
c) rinsing the substrate with a solvent; and
d) selectively removing the complex-bound modified surface layer of the polycrystalline material by exposing the complex-bound modified surface layer to a dissolution solution to dissolve the complex-bound modified surface layer; and
wherein said rinsing the substrate is performed for a time period that increases during said performing the multiple cycles of the wet ALE process.

16. The method of claim 15, wherein during each cycle, a) and b) are performed with at least partial temporal overlap.

17. The method of claim 15, wherein during each cycle, a) and b) are performed sequentially with no temporal overlap.

18. The method of claim 15, wherein during each cycle, b) and d) are performed with at least partial temporal overlap.

19. The method of claim 15, wherein the exposed surface of the polycrystalline material has a surface roughness characterized by a first surface roughness value after performing one or more first cycles of the wet ALE process, and the surface roughness is reduced to a second surface roughness after performing one or more second cycles of the wet ALE process, wherein the one or more second cycles are performed after the one or more first cycles.

20. The method of claim 15, wherein the polycrystalline material is a transition metal.

21. The method of claim 15, wherein the polycrystalline material comprises copper (Cu), ruthenium (Ru) or cobalt (Co).

* * * * *